(12) United States Patent
McLaughlin et al.

(10) Patent No.: US 6,442,216 B1
(45) Date of Patent: Aug. 27, 2002

(54) DIGITAL DEMODULATOR USING BOXCAR FILTERS AND BOXCAR FILTER SECTIONS

(75) Inventors: Kevin McLaughlin, Lake Worth, FL (US); James Rodney Webster, Manitou Springs, CO (US); Manbir Nag, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/034,281

(22) Filed: Mar. 4, 1998

(51) Int. Cl.$^7$ .............................. H03D 3/00; H03D 3/22; H04L 27/22
(52) U.S. Cl. ..................... 375/322; 375/329; 329/304
(58) Field of Search .................... 375/322, 316, 375/269, 271, 272, 273, 323, 324, 334, 335, 350, 329, 332, 279, 280, 281; 455/232.1, 234.1, 235.1, 42; 329/300, 304, 310, 315

(56) References Cited

U.S. PATENT DOCUMENTS

| | | | |
|---|---|---|---|
| 5,001,776 A | * 3/1991 | Clark | 455/226.2 |
| 5,469,112 A | 11/1995 | Lee | |
| 5,535,444 A | * 7/1996 | Grandfield | 455/232.1 |
| 5,564,092 A | * 10/1996 | Grandfield et al. | 455/232.1 |
| 5,606,731 A | 2/1997 | Pace et al. | |
| 5,633,895 A | 5/1997 | Powell, II et al. | |

OTHER PUBLICATIONS

Park, John H., An FM Detector fo Low S/N, Apr., 1970, IEEE Transactions in Communications, vol. COM–18, No. 2, pp. 110–118.*
Frerking, Marvin E., Digital Signal Processing in Communication Systems, 1994, Kluwer Academic Publishers, pp. 193–199, 249, 250, 329–333.*

* cited by examiner

Primary Examiner—Stephen Chin
Assistant Examiner—Betsy L. Deppe
(74) Attorney, Agent, or Firm—Randi L. Dulaney; Andrew S. Fuller

(57) ABSTRACT

A digital demodulator (100) includes a differentiate and cross multiply stage (102) and a plurality of filter/decimator stages (106, 112, 118 and 108, 114, 120 and 110, 116, 122) that accept both multiple baud rates and multiple modulation deviation frequencies, and that provide a common frequency data stream at their respective outputs. One of said filter/decimator stages is coupled to a primary filter (124) which is followed by a box filter (134). The box filter (134) improves the overall filter response and provides notches at a specified frequency (e.g., 4800 Hz) and its harmonics. Demodulator (100) provides improved sensitivity without the need for any circuit trimming. The filter stages (e.g., 106, 112, 118; 108, 114, 120; and 110, 116, 122) used in demodulator (100) have been optimized to eliminate the need for costly multipliers.

13 Claims, 11 Drawing Sheets

FREQUENCY RESPONSE

POINT# = 2078
BIN# = 30
PTS = 4097
FREQ = 281.25
MAG. = 21.5368
PHASE = -0.207102

DIGITAL DEMODULATOR USING BOXCAR FILTERS AND BOXCAR FILTER SECTIONS

FIELD OF THE INVENTION

This invention relates in general to electronic circuits and more specifically to a digital demodulator and a communication device having said digital demodulator.

BACKGROUND OF THE INVENTION

Thus far, some communication devices such as paging products have exclusively used the superheterodyne receiver as its principal method to recover data from the frequency modulated (FM) signal which is received. The superheterodyne receiver provides a filtered signal at some intermediate frequency (IF) to the demodulator circuit. This requires the use of a traditional FM demodulator such as a frequency discriminator.

With the introduction of zero IF (ZIF) technology into pagers and other communication devices, new technology for a demodulator has to be developed. The zero IF technology generates an I and Q signal which are in phase quadrature. A need thus exists in the art for a digital demodulator which can accept the I and Q signals and optimally decode the data at different baud rates (e.g., 512, 1200, 2400 bits-per-second, etc.) and a communication device which can use such a demodulator. It would also be beneficial if the digital demodulator could also operate in non-zero IF environments such as when using up-mixing techniques to produce an intermediate non-zero IF which is then demodulated.

DESCRIPTION OF THE PREFERRED EMBODIMENT

Figure 1:
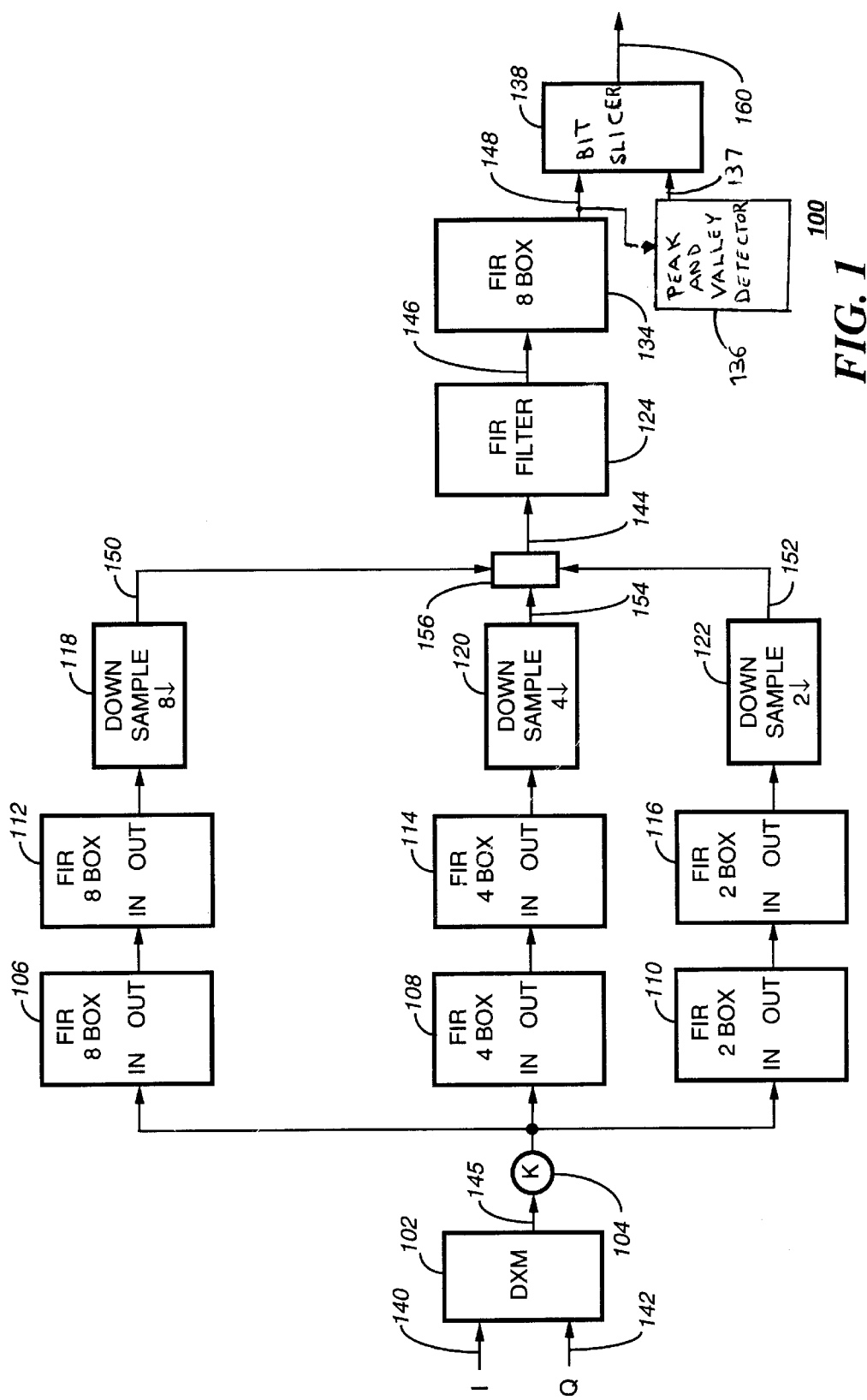
FIG. 1 is a block diagram of a digital demodulator in accordance with the invention.

Referring now to the drawings and in particular to FIG. 1, there is shown a digital demodulator 100 in accordance with the preferred embodiment of the invention. Digital demodulator 100 comprises a differentiate and cross-multiply stage, a five-stage post detection filter (PDF), and a threshold detector. Each section of the five-stage PDF has been chosen for two characteristics. First low cost and second high performance. Low cost has been achieved by not using any multipliers in any of the filter sections. This low cost requirement makes achieving the second requirement of high performance difficult. Without using multipliers, each filter section does not have optimal frequency response.

High performance is achieved in the present invention by careful matching of the desirable and undesirable characteristics of each section of the demodulator 100 such that the overall combination meets the "designed for" performance criteria but yet achieves these results at a low cost. The finite impulse response (FIR) filter characteristics for the present demodulator have been chosen to maximize rejection and provide acceptable performance using a limited in phase/quadrature phase (I/Q) detector, with the five-stage post detection filter optimized to eliminate multipliers.

Figure 2:
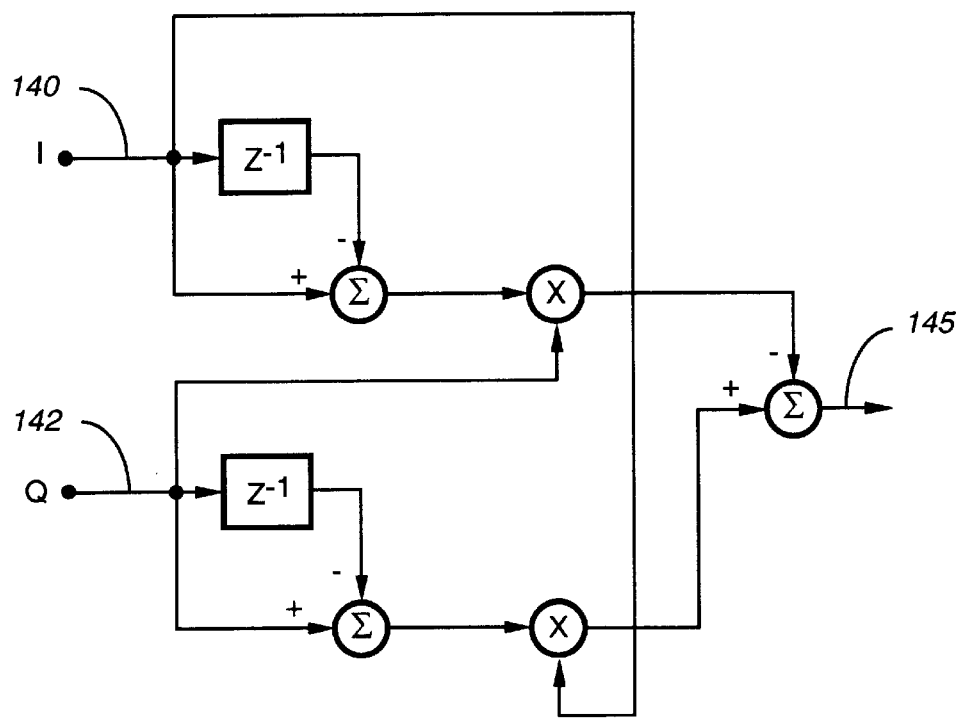
FIG. 2 is a representation of a differentiate and cross-multiply circuit which can be used with the demodulator shown in FIG. 1.
Figure 3:
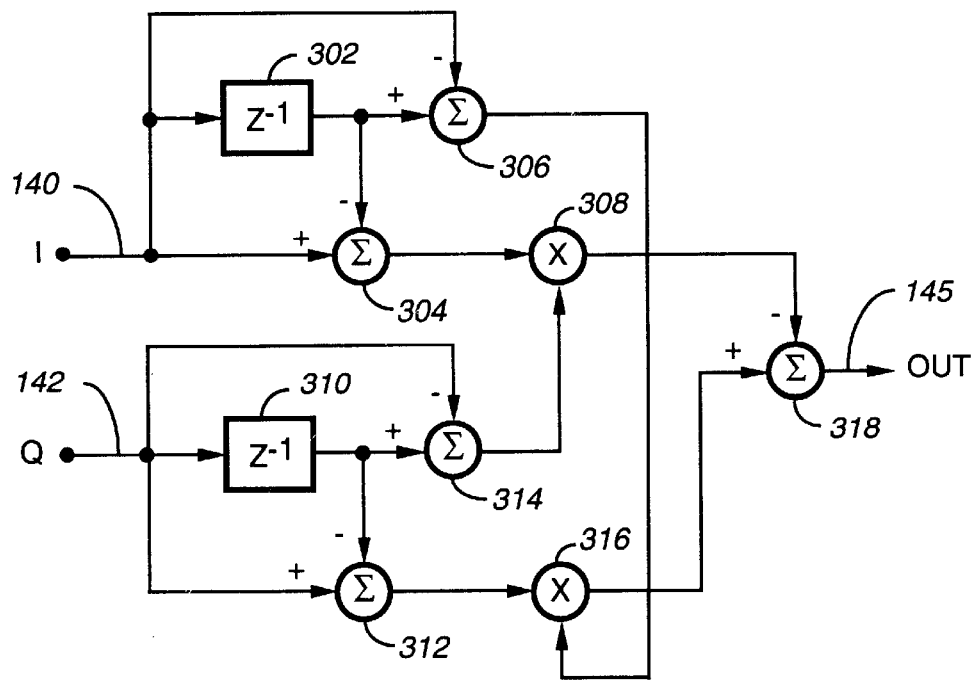
FIG. 3 is a representation of an alternate differentiate and cross-multiply circuit which can be used with the demodulator shown in FIG. 1.

The demodulator 100 comprises input ports 140 and 142 for receiving respective I and Q signals from a zero IF circuit (not shown). The I 140 and Q 142 signals are received by a differentiate and cross multiply ("DXM") circuit 102. Details of the DXM circuit 102 are shown in FIGS. 2 and 3. FIGS. 2 and 3 are both DXM blocks, but FIG. 3 uses two extra adders to form a length-two box car filter. This limits the rate at which changes can occur in the I and Q signals which tends to improve performance if the baseband filter bandwidth happened to be wider than normal. This extra filtering can be added at a minimal cost since the delay stage is shared by the differentiator stage.

Figure 4:
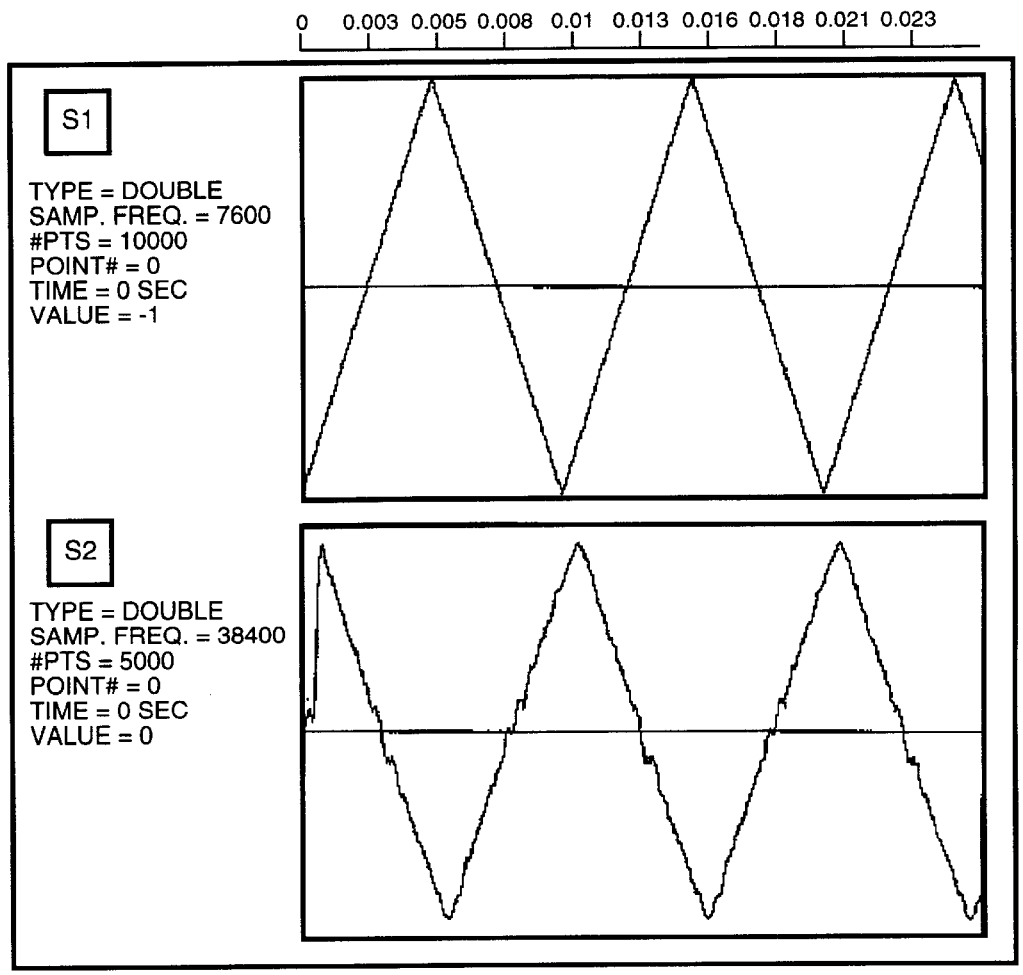
FIG. 4 shows signal graphs for the input and output signals going into and coming out from the differentiate and cross-multiply circuit.

In the preferred embodiment, the DXM block shown in FIG. 3 is utilized for DXM block 102 in demodulator 100. The linearity of the DXM block shown in FIG. 3 is shown in FIG. 4. The top most or "S1" graph is the input signal into the DXM, while the lower or "S2" graph is the output signal 145. The deviation used in the simulation to generate the graphs S1 and S2 was +/−10 kilohertz (Khz).

The DXM shown in FIG. 3 comprises two conventional one-sample delay elements 302 and 310, five conventional summers 304, 306, 312, 314, 318, and two conventional multiplier elements 308, 316 interconnected as shown.

Following the DXM stage 102 is an optional gain stage 104 which amplifies the signal if required (e.g., when using demodulator 100 in a FLEX paging protocol environment) at output 145 of DXM block 102. The gain stage 104 is not necessary in some situations such as in a POCSAG (Post Office Code Standardisation Advisory Group) paging protocol environment. The output of the gain stage 104 is coupled to a cascade of two box car (comb) filters (all with coefficients=1) to prevent aliasing before down sampling each of the three baud rates branches. The purpose of this simple first stage is to reduce the size of the main post detection filter. This is required because the sample rate (fs=76,800 Hz) in the preferred embodiment is much higher than the sample rate predicted from the bandwidth of the incoming signal.

Figure 5:
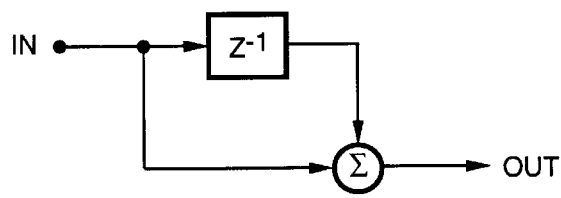
FIG. 5 shows a representation of a box car filter which can be used in the demodulator shown in FIG. 1.
Figure 6:
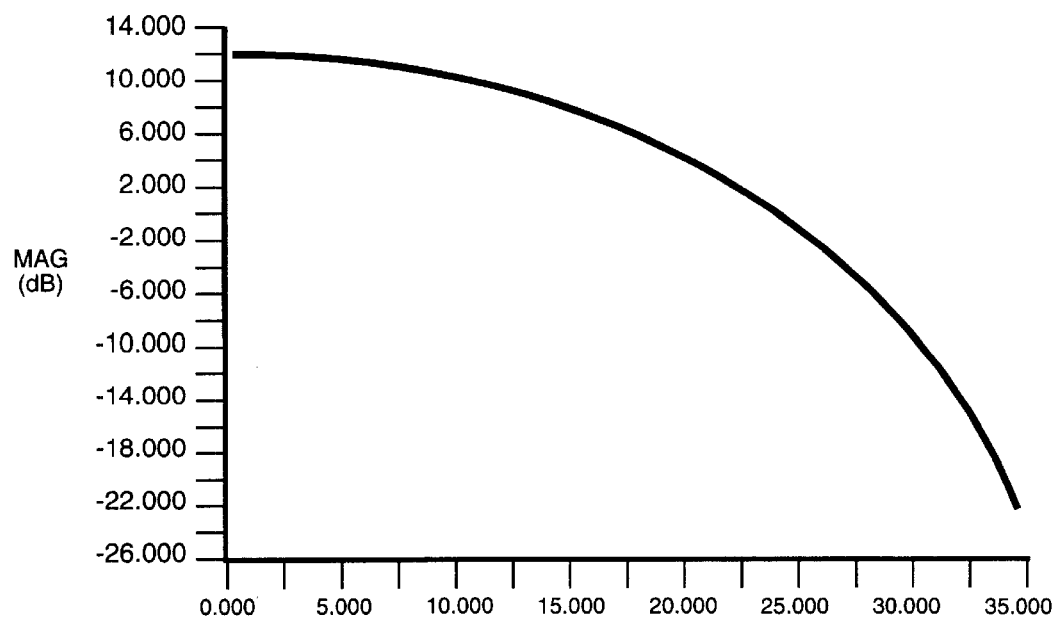
FIG. 6 shows a plot of the frequency response of the two length-two box car filters used with the demodulator shown in FIG. 1.
Figure 8:
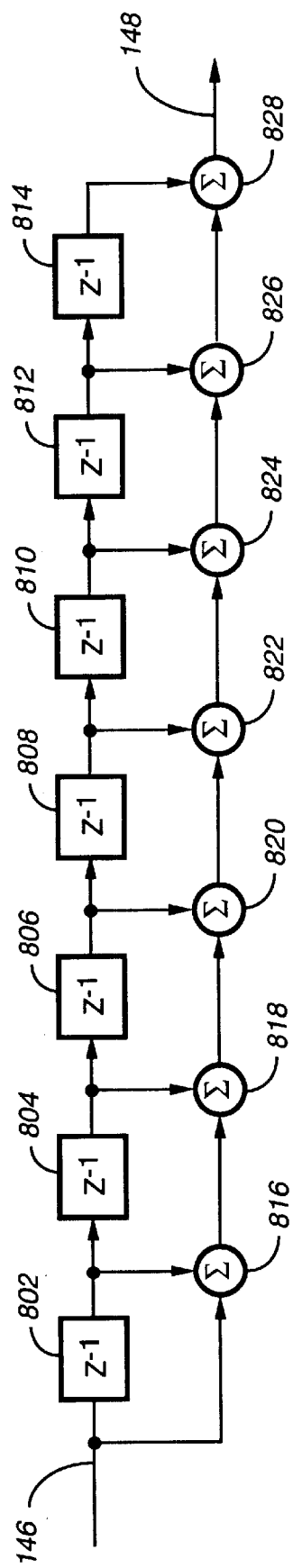
FIG. 8 shows details of the FIR box car filter which is located after the primary filter in the demodulator shown in FIG. 1.

Details of one of these FIR filters is shown in FIG. 5. The two length-box car, filters 110, 116 are as shown in FIG. 5, while the eight length box car filters 106, 112 are as shown in FIG. 8. Although the four length box car filters 108, 114 are not shown, they would comprise three one sample delay elements and three summers interconnected in similar fashion as the length-two and eight length box car filters. FIG. 6 is a plot of the frequency response of the two length-two box car filters 110, 116 as an example. Variations to the frequency response shown in FIG. 6 occur for the two length-four box car filters 108, 114 and the two length-eight box car filters 106, 112.

Since the demodulator 100 of the present invention has been designed so that it can be used in communication receivers such as pagers which are manufactured to operate at different baud rates depending on the particular paging system they intend to be used in, the demodulator 100 has been designed to include a plurality of different circuit paths. One of the circuit paths is selected for a particular communication device depending on the baud rate required.

In the preferred embodiment, the top branch forms a 512 baud branch and includes filter stages 106 and 112. The middle branch forms a 1200 baud branch and includes the filter stages 108 and 114. The bottom branch comprises a 2400 baud branch and includes the filter stages 110 and 116. Each of the circuit branches includes a respective conventional down sampler stage 118, 120 or 122. The down samplers decimate the incoming signal by two for the 2400 baud branch (down sampler 122), by four for the 1200 baud branch (down sampler 120) and by eight for the 512 baud branch (down sampler 118).

During manufacture, the appropriate down sampler output 150, 152 or 154 is electrically connected to node 144 which connects the appropriate down sampler output 150, 152 or 154 to the rest of the demodulator circuit via switch circuit 156. This branch selection can be performed using any one of a number of conventional techniques. For example, by adding an electrical jumper between the selected down sampler output port 150, 152 or 154 and node 144 at switch 156. Alternatively, the proper down sampler 150, 152 or 154 can be selected by passing an electrical current to the demodulator 100 during manufacture which creates an electrical open circuit between the down sampler outputs and node 144 for the two branches which are not selected. Other well-known techniques known in the art can also be performed in order to electrically interconnect the desired branch with node 144.

Figure 7:
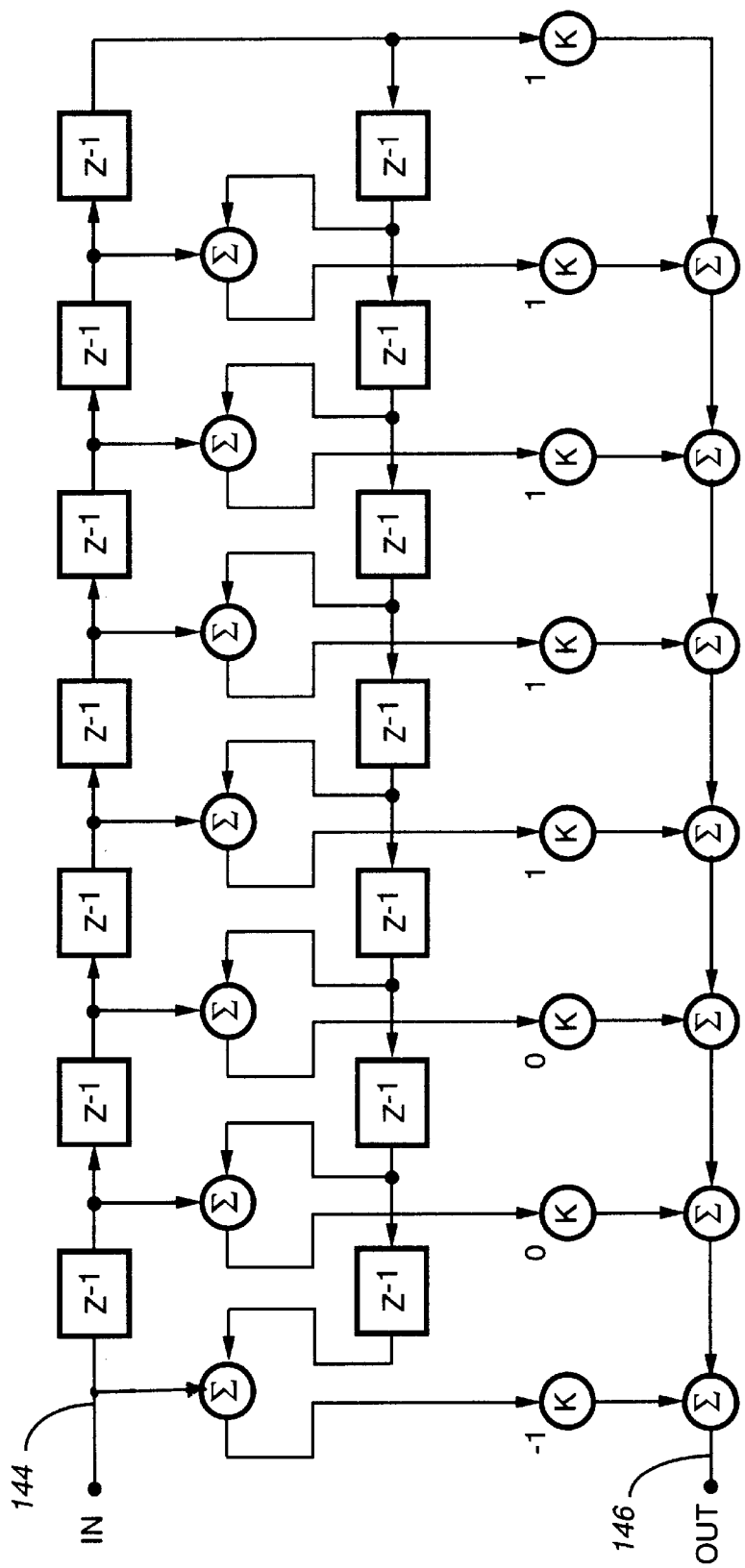
FIG. 7 shows a representation of the primary filter used in the demodulator shown in FIG. 1.

The rest of the discussion will focus on the 1200 baud branch (middle branch) since this is the branch which from here on out is assumed to be the branch connected to node 144 and the rest of the demodulator circuit. The next stage after the down sampler stage 120 is the primary FIR filter 124. Its sample rate in the preferred embodiment is 19200 hertz (76800 Hz/4) as a result of the decimate by 4 from the down sampler stage 120. This reduces the length of the filter required to filter the audio. A more detailed presentation of this filter is shown in FIG. 7. This filter has a length of 15 and coefficients of (−1 0 0 1 1 1 1 1 1 1 1 1 0 0 −1). With the design of the present invention, the filter coefficients are fixed. To lower or raise the bandwidth of the demodulator 100 for the other data rates (2400 or 512 baud), instead of modifying the primary filter 124, different box car filters and decimators are used. For example, to move to 2400 baud, the bottom path having FIRs 110, 116 and down sampler 122 are connected to node 144 instead of using the middle branch. The architecture of the present invention makes the simpler blocks the variable elements, thereby reducing the overall cost of the design.

Coupled to the output 146 of the primary filter 124 is a length-eight box car filter 134, details of this filter are shown in FIG. 8. The length-eight box car filter 134 in the preferred embodiment has only 13 decibel (db) rejection above 5 Khz, but when combined with the other four stages, the overall frequency response is improved substantially. Of greater importance is that the length of the filter and sample rate result in nulls at 4800 hertz (Hz) and its harmonics. These nulls achieve a very high attenuation but yet the filter 134 is very low in cost. A special technique must be applied which requires that the post-detection filtering substantially suppress all frequency components that appear at 4 times (4×) the various modulation deviation frequencies. This suppression is necessary because, for example, a POCSAG paging protocol detector produces pulse-trains as an output with four pulses per complete phasor rotation. It is desirable to remove the actual pulse-train waveform, while leaving behind the average number of pulses-per-second which is then used to determine the transmitted symbol information. A filter with the above described suppression characteristics will accomplish this task quite well, since a deviation of +/−4800 Hz produces pulse-trains with a frequency of 19.2 Khz, which is a multiple of 4800 Hz.

It will be noted that suppression of frequencies at four times (4×) the various modulation deviation frequencies becomes even more practical and accurate when dealing with a modern signaling code such as the FLEX (trademark of Motorola, Inc.) paging protocol. The transmitter symbol-mapping (deviation) specification for this protocol requires a high degree of accuracy, thus providing far greater filtering accuracy for limited I/Q ZIF detection than would be possible with the less strictly defined POCSAG signaling protocol, for example. It might also be noted that FLEX deviations of +/−1600 Hz requires notches at 4800 Hz (four times 1600 Hz) rather than 19200 Hz, which demodulator 100 already provides for.

Figure 9:
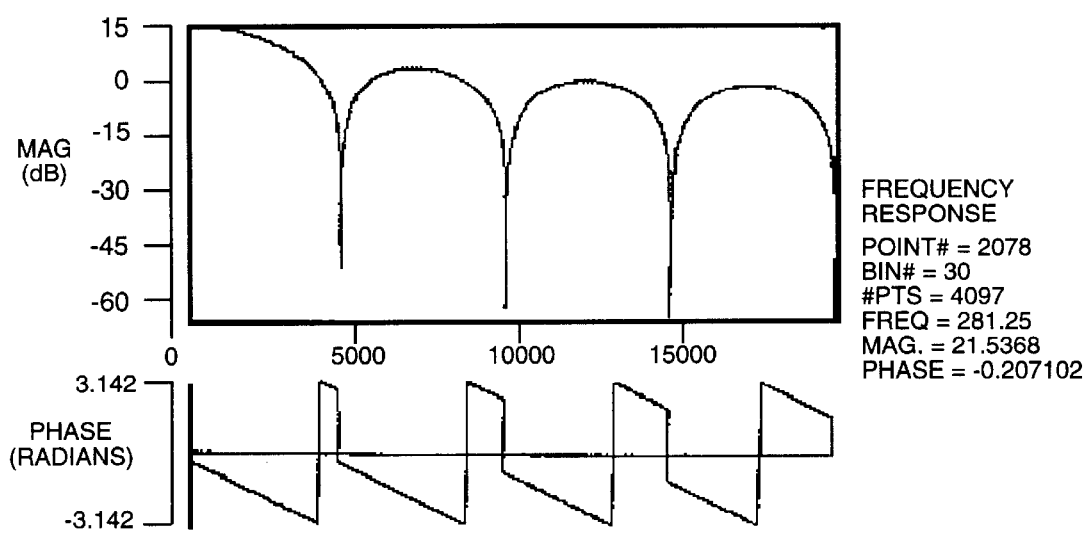
FIG. 9 shows the frequency response for the FIR box car filter shown in FIG. 8.

The frequency response of filter 134 is shown in FIG. 9. The length eight FIR filter 134 shown in FIG. 8 has coefficients equal to {1,1,1,1,1,1,1,1}. The input signal which is received at node 146 is passed through one-sample delay elements 802–814 and summers 816–828 to produce a filtered output signal at node 148. The main purpose of FIR filter 134 in the preferred embodiment is to improve the overall filter response and to provide notches at 4800 Hz and its harmonics. Since 4800 Hz is a common deviation used in POCSAG and FLEX paging protocol systems, this will cause most of the signal energy at the discriminator output to occur at 4 times (4×) 4800 Hz and its harmonics. The filter 134 in the preferred embodiment generates nulls at 4800 Hz and its harmonics, however, the fly-back in between limits the rejection to 13 db. Thus, if the filter nulls can occur where most of the undesired signal energies are located, then the filter 134 will behave as if it where a much higher performance filter at no extra cost. This is what is achieved with this design, since the undesired signal energies occur at four times (4×) 4800 Hz and multiples of it.

Figure 13:
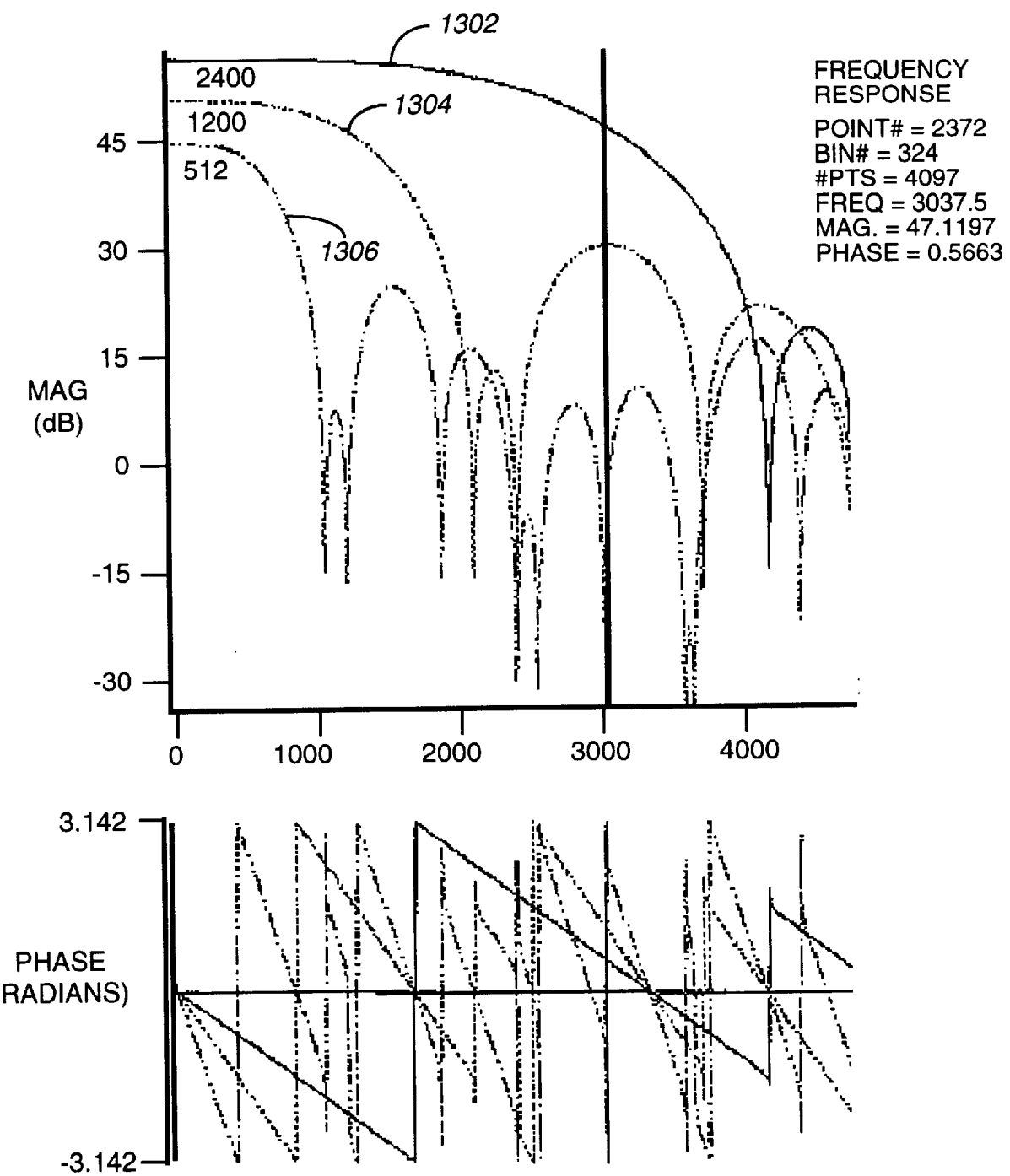
FIG. 13 shows a graph highlighting the total demodulator post detection filter frequency response.

The total demodulator post detection filter frequency response is shown in FIG. 13 for each of the baud rates. Graph 1302 is for the 2400 baud rate, graph 1304 is for the 1200 baud rate and graph 1306 is for the 512 baud rate. Note that above 4 Khz minimum attenuation is 22 db and below 1200 Hz the filter is flat to within 1 db amplitude ripple.

Figure 14:
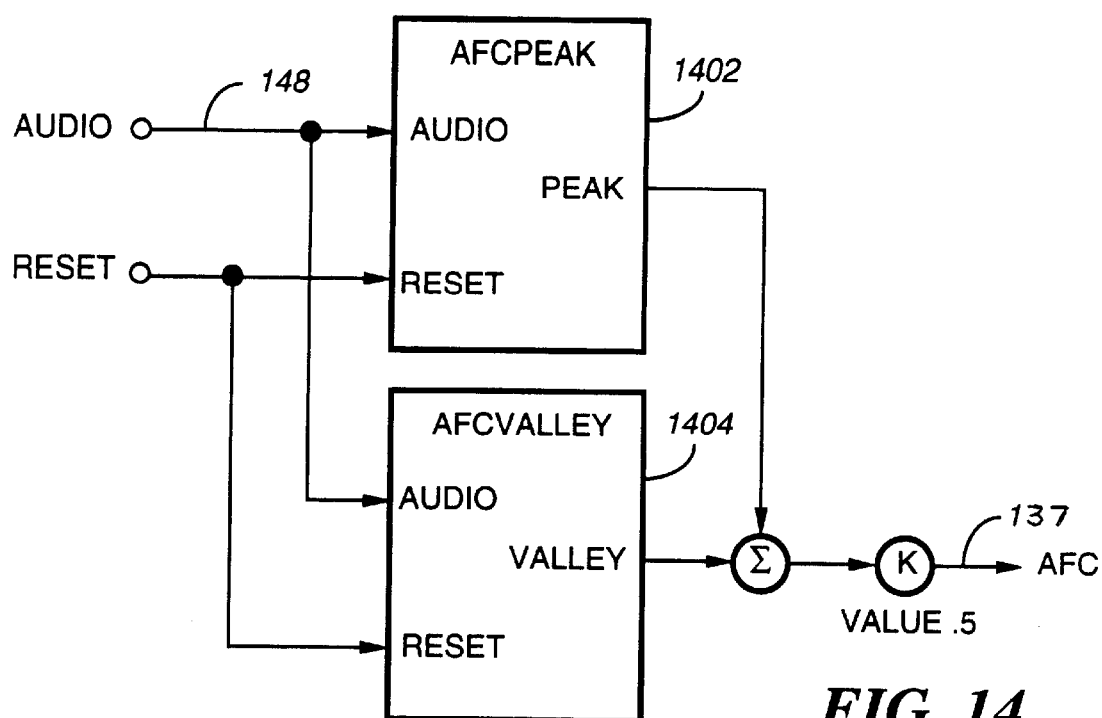
FIG. 14 is a block diagram of the peak and valley data recovery block used in the demodulator in accordance with the invention.

The last stage of the demodulator 100 is a conventional peak and valley data recovery block 136 having as inputs the output 148 of the length eight FIR filter 134 and a RESET control line. More detailed design of this block is shown in FIG. 14. The peak and valley data recovery block 138 is a fast attack, slow decay peak and valley system. The fast attack allows the system to acquire the reference for data recovery rapidly and the slow decay improves noise immunity. The peak and valley recovery block 136 includes peak 1402 and valley 1404 detector circuits. The output of these circuits are averaged together by a summer circuit and a gain stage which divides the signal by two. The output signal 137 is then used as a binary midpoint threshold input into a conventional bit slicer 138.

Bit slicer 138 provides recovered data ouput 160 by comparing signal 148 with signal 137 to determine whether signal 148 is above the threshold signal 137 which implies a +4800 Hz deviation or below the threshold signal 137 which implies a –4800 Hz deviation. In the case that a reset condition is required, the RESET line is provided in the peak and valley detector. The reset signal can originate from the communication device controller, for example processing system 1508.

Figure 10:
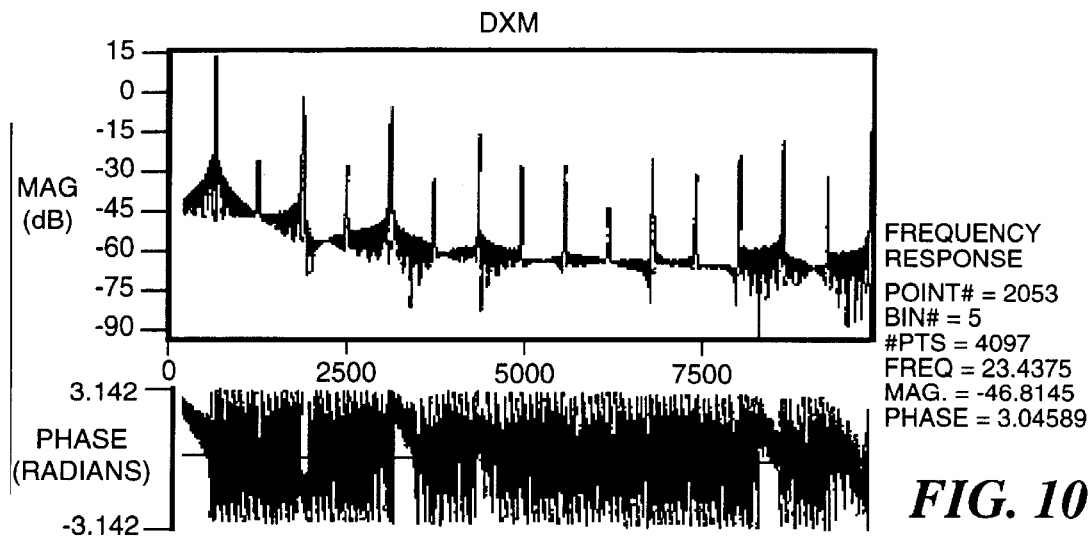
FIG. 10 shows the output spectrum for the differentiate and cross multiply stage in a 1200 bps configuration in accordance with the invention.
Figure 11:
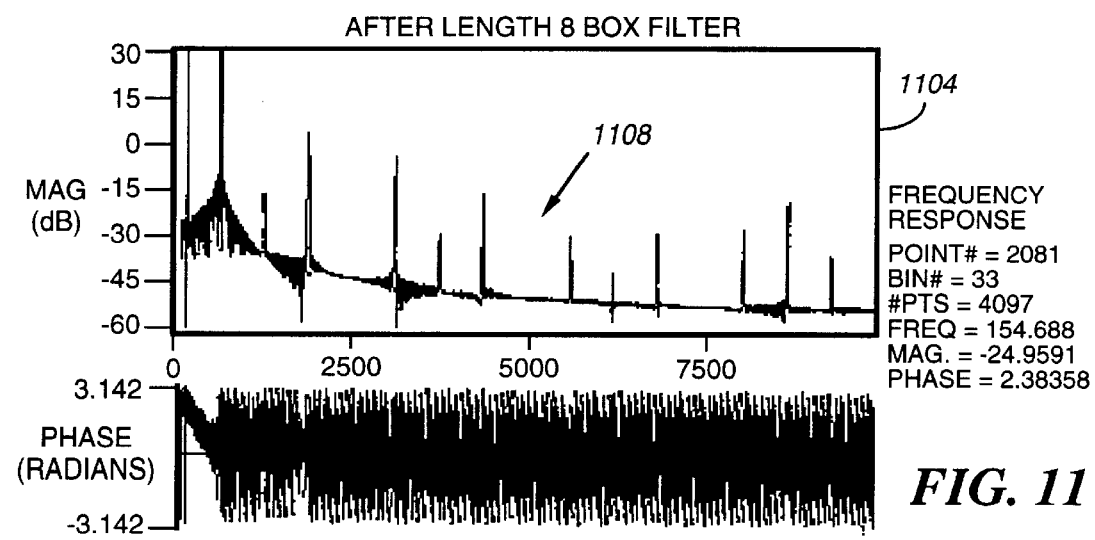
FIG. 11 shows the frequency spectrum after filtering by the length-eight box car filter in accordance with the preferred embodiment of the invention.
Figure 16:
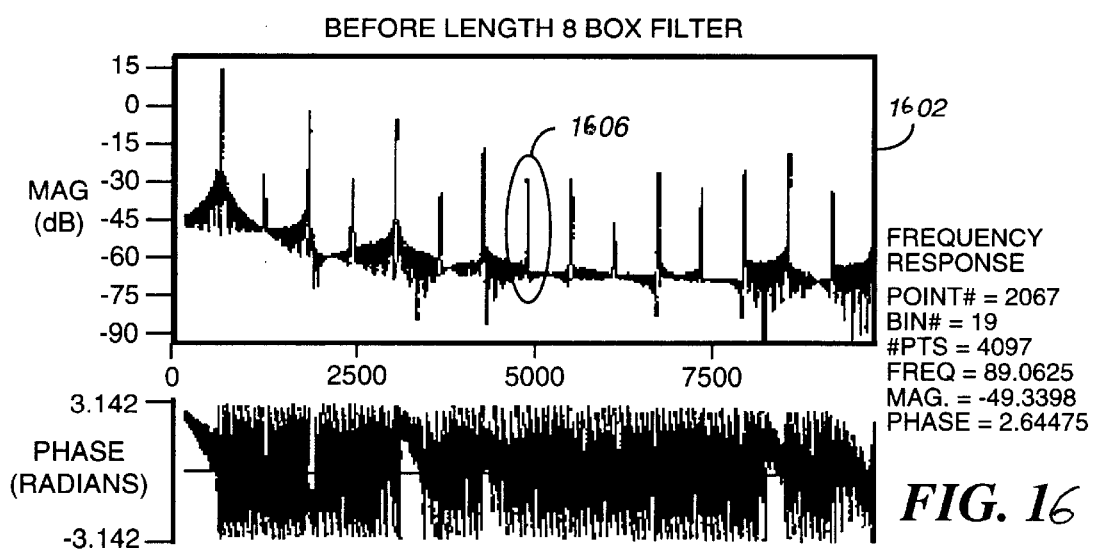
FIG. 16 shows the frequency spectrum before filtering by the length-eight box car filter in accordance with the preferred embodiment of the invention.
Figure 12:
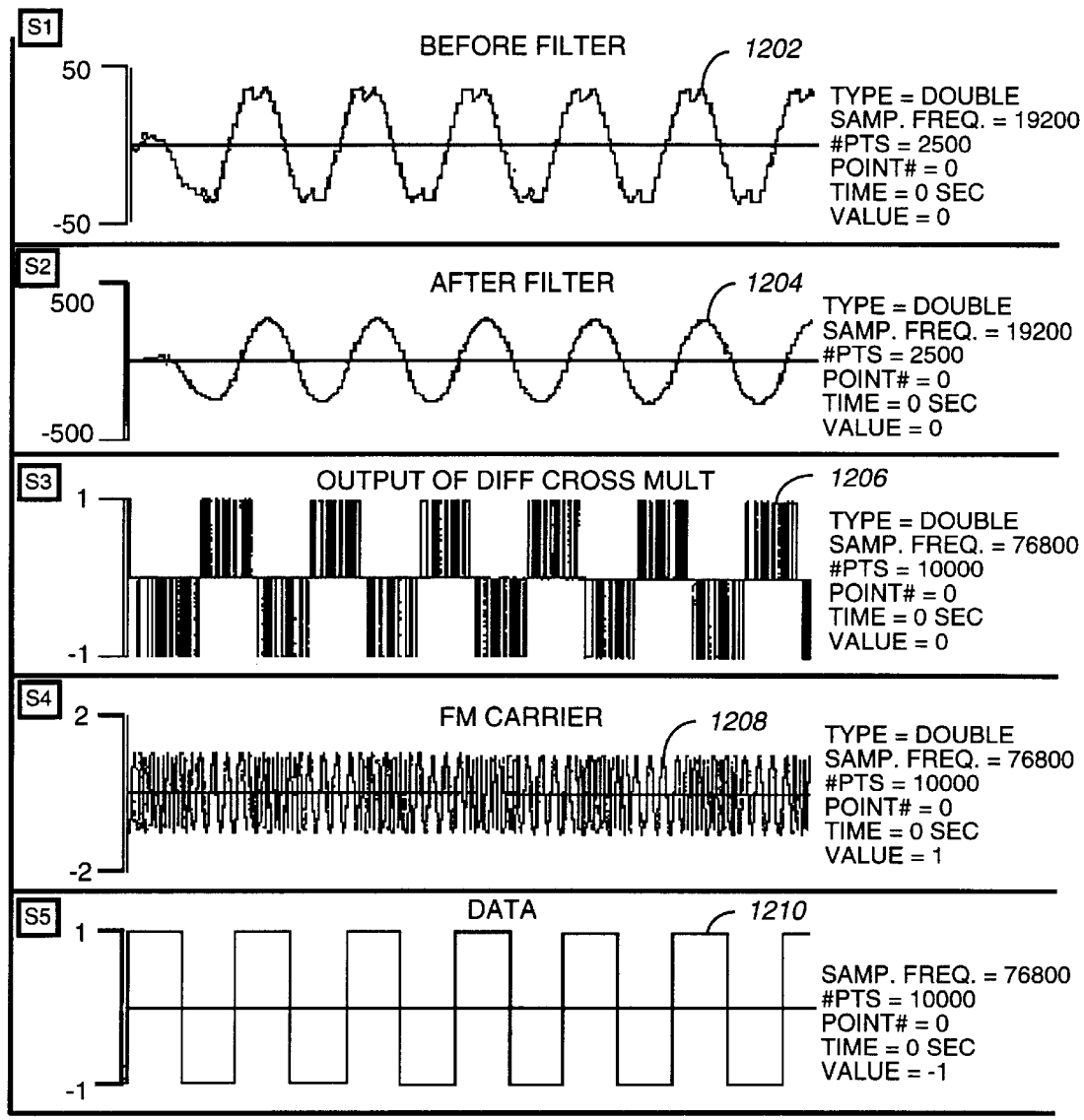
FIG. 12 shows time domain graphs at different points of the demodulator shown in FIG. 1.

Referring to FIG. 12, graph 1206 (labeled S3) shows the time domain output 145 of the DXM stage 102 in a 1200 bps configuration. FIG. 10 is the spectrum of the signal at output 145. The energy in this signal is concentrated in very narrow regions in multiples of 600 Hz. The fundamental component (600 Hz) is the desired signal. All other harmonics need to be eliminated by filtering. In FIG. 16, graph 1602 is the signal spectrum of the signal entering the length eight FIR filter 134 at input 146. Graph 1104 in FIG. 11 is the spectrum after the signal has passed through the length eight FIR filter 134. As shown, filter 134 has eliminated much of the undesired signal energy since many of the harmonics of 600 Hz coincide with harmonics of 4800 Hz. In graph 1602 a 4800 Hz harmonic 1606 is removed by filter 134 as shown at location 1108 in the post filtering graph 1104.

In FIG. 12, graph 1202 (labeled Si) is the time domain plot of a signal at the input 146 of filter 134, and graph 1204 is the time domain plot of the signal at output 148. As shown in graph 1204, the signal quality of the signal has been greatly improved by filter 134. Graph 1208 highlights the frequency modulated carrier, while graph 1210 highlights the data signal of the preferred embodiment.

Figure 15:
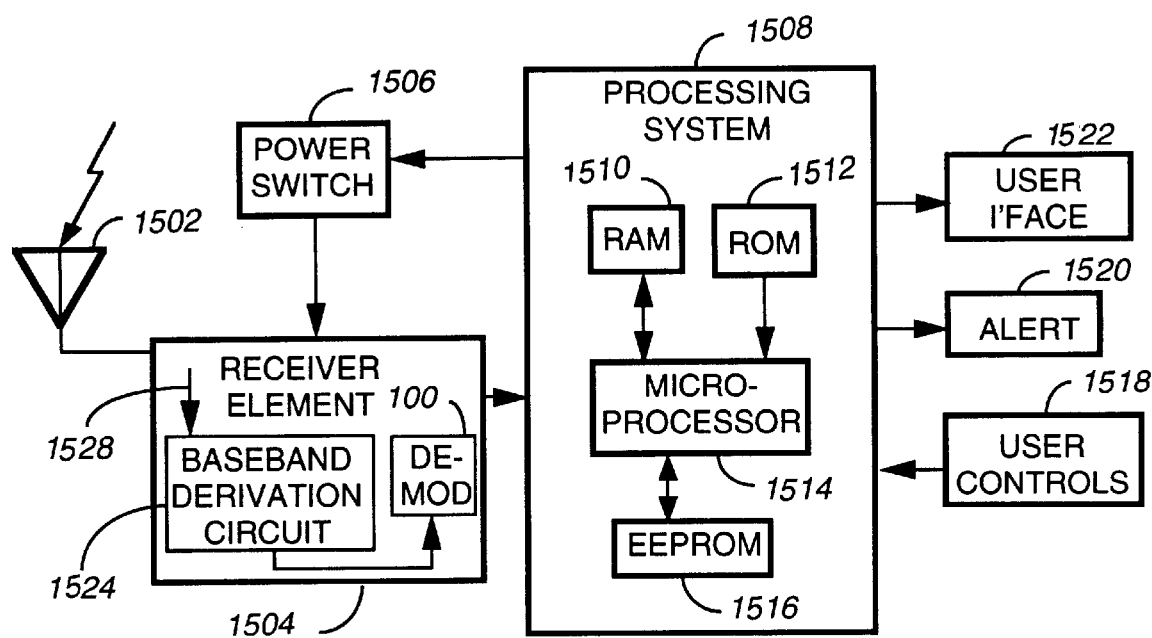
FIG. 15 shows a block diagram of a communication device which can use the digital demodulator of the present invention.

A communication receiver 1500 such as a pager which can use the digital demodulator 100 of the present invention is shown in FIG. 15. The communication receiver 1500 includes an antenna 1502 for intercepting a RF signal comprising information from a transmitting station (not shown). The antenna 1502 is coupled to a receiver element 1504 for down-converting the RF signal to derive an intermediate signal 1528 using techniques well known in the art. The receiver element 1504 includes a baseband derivation circuit 1524 coupled to the IF signal 128 for deriving in phase (I) and quadrature-phase (Q) signals therefrom. The I and Q signals are coupled to demodulator 100 which demodulates the signals in accordance with the present invention. The receiver element 1504 is coupled to a processing system 1508 for further processing of the information. A conventional power switch 1506, coupled to the processing system 1508, is used to control the supply of power to the receiver element 1504, thereby providing a battery saving function.

To perform the necessary functions of the communication receiver 1500 the processing system 1508 includes a microprocessor 1514, a random access memory (RAM) 1510, a read-only memory (ROM) 1512, and an electrically erasable programmable read-only memory (EEPROM) 1516. Preferably, the microprocessor 1514 is similar to the M68HC08 microcontroller manufactured by Motorola, Inc. It will be appreciated that other processors can be utilized for the microprocessor 1514, and that additional processors of the same or alternative type can be added as required to handle the processing requirements of the processing system 1508. It will be appreciated that other types of memory, e.g., EEPROM or FLASH, can be utilized for the ROM 1512, as well as the RAM 1510. It will be further appreciated that the RAM 1510 and the ROM 1512, singly or in combination, can be manufactured as an integral portion of the microprocessor 1514.

The processing system 1508 is programmed by way of the ROM 1512 to process incoming messages transmitted by the transmitting station. During message processing, the processing system 1508 decodes in a conventional manner an address in a portion of the demodulated information, compares the decoded address which is received with one or more addresses stored in the EEPROM 1516, and when a match is detected, proceeds to process the remaining portion of the information to derive the message. Once the processing system 1508 has processed the information, it stores the message in the RAM 1510, and a call alerting signal is generated to alert a user that a message has been received. The call alerting signal is directed to a conventional audible or tactile alerting device 1520 for generating an audible or tactile call alerting signal.

The message which has been received can be accessed by the user through user controls 1518, which provide functions such as lock, unlock, delete, read etc. More specifically, by the use of appropriate functions provided by the user controls 1518, the message is recovered from the RAM 1510, and then conveyed to the user by way of a user interface 1522 comprising a display for displaying an alphanumeric message. Alternatively, the user interface 1522 can comprise a loudspeaker for reproducing a voice message.

It should be noted that the above described filtering requirement also applies when using up-mixing techniques to convert limited I/Q ZIF receiver outputs to an intermediate non-zero IF which is then demodulated using a more conventional (but still digital) superheterodyne detector (such as a digital discriminator). Ninety degree phase shift information is encoded in the ZIF limited I/Q signals from the receiver (there are four of these 90 degree phase shifts in a single rotation around the complex phasor). A digital up-mix scheme will generate an intermediate non-zero limited IF signal (at 140 Khz, for example) which has these 90 degree phase shift events applied to it under direct control of the ZIF limited I/Q signals. Because the resulting superheterodyne detector output (when driven by such an up-mix generated IF signal) will look nearly identical to that of a ZIF limited I/Q digital differentiate-and-cross-multiply detector, both outputs will consist of the earlier-described pulse-train and the demodulation process will be completed by the application of the earlier-described filter characteristic.

In summary, the demodulator 100 of the preferred embodiment has characteristics which are chosen to maximize rejection, and provide acceptable performance using a limited I/Q detector. The demodulator 100 has also been optimized to eliminate costly multipliers in the filter stages. Since all parts of the post detection filter are composed of FIR filters, the entire system has a linear phase response. This will reduce inter-symbol interference and improve sensitivity. While the preferred embodiments of the invention have been illustrated and described, it will be clear that changes, variations, substitutions and equivalents will occur to those skilled in the art without departing from the spirit and scope of the present invention as defined by the appended claims.

What is claimed is:

1. A digital demodulator which receives an input signal transmitted at a plurality of modulation deviation frequencies, comprising:
    a digital differentiate and cross-multiply discriminator which receives the input signal and which produces a digitized signal digitized at a sampling frequency, the digitized signal representing the plurality of modulation deviation frequencies; and
    a post detection filter responsive to the digitized signal, the post detection filter including
        a boxcar filter for filtering the digitized signal and producing a filtered digitized signal,
        a down sampler coupled to the boxcar filter for decimating the filtered digitized signal to produce a decimated signal, and
        a fixed-length boxcar filter which suppresses frequencies at multiples of a sampling frequency used to generate the decimated signal and produces a filtered output signal when the sampling frequency used to generate the decimated signal is a multiple of the plurality of modulation deviation frequencies.

2. The digital demodulator as defined in claim 1, wherein the fixed-length boxcar filter has nulls that occur at integer multiples of the plurality of modulation deviation frequencies.

3. The digital demodulator as defined in claim 2, wherein the post detection filter does not utilize any multipliers.

4. The digital demodulator as defined in claim 1, wherein the input signal to the digital demodulator comprises in-phase and quadrature phase signals.

5. The digital demodulator as defined in claim 1, further comprising:
    a peak and valley threshold detector responsive to the filtered output signal provides a threshold signal; and
    a bit slicer which compares the filtered output signal and the threshold signal to generate a recovered data signal.

6. A communication device, comprising:
    an antenna for intercepting radio signals transmitted at a plurality of modulation deviation frequencies, the radio signals comprising information;
    a receiver element coupled to the antenna for down-converting the radio signals to derive an analog signal and for demodulating the analog signal;
    a processing system coupled to the receiver element for processing the information; and
    a user interface coupled to the processing system for conveying the information to a user,
    wherein the receiver element comprises a baseband derivation circuit for deriving in-phase and quadrature-phase baseband signals having a plurality of modulation deviation frequencies from the analog signal, the receiver element further comprising
        a digital demodulator coupled to the baseband derivation circuit, the digital demodulator including
            a digital differentiate and cross-multiply discriminator which receives the I and Q baseband signals and produces a digitized signal digitized at a sampling frequency, and
            a post detection filter responsive to the digitized signal, the post detection filter including
                a boxcar filter for filtering the digitized signal and producing a filtered digitized signal,
                a down sampler coupled to the boxcar filter for decimating the filtered digitized signal to produce a decimated signal, and
                a fixed-length boxcar filter which suppresses frequencies at multiples of a sampling frequency used to generate the decimated signal, when the sampling frequency is a multiple of the plurality of modulation deviation frequencies.

7. The communication device as defined in claim 6, wherein the post detection filter does not use any multipliers.

8. The communication device as defined in claim 6, wherein the fixed-length boxcar filter has nulls that occur at integer multiples of the plurality of modulation deviation frequencies.

9. The communication device as defined in claim 6, wherein the communication device comprises a pager.

10. The communication device as defined in claim 6, further comprising:
    a peak and valley threshold detector coupled to the fixed-length boxcar filter.

11. A demodulator which receives an input signal having a first baud rate and a second baud rate transmitted at a modulation deviation frequency, comprising:
    a digital differentiate and cross-multiply discriminator which receives the input signal and which produces a digitized signal digitized at a sampling frequency; and
    a post detection filter stage responsive to the digitized signal, the post detection filter the including
        a first filter section comprising
            a first boxcar filter for filtering the digitized signal received at the first baud rate and for producing a first filtered digitized signal, and
            a first down sampler coupled to the first boxcar filter providing a first decimation factor for decimating the first filtered digitized signal to produce a decimated output signal at a first data rate,
        a second filter section comprising
            a second boxcar filter for filtering the digitized signal received at the second baud rate and for producing a second filtered digitized signal, and
            a second down sampler coupled to the second boxcar filter providing a second decimation factor for decimating the second filtered digitized signal to also produce the decimated output signal at the first data rate,
        wherein the first decimation factor is different then the second decimation factor, and
        a fixed-length boxcar filter which suppresses frequencies at multiples of a sampling frequency used to generate the decimated output signal, when the sampling frequency is an integer multiple of the modulation deviation frequency.

12. The demodulator as defined in claim 11, wherein the post detection filter stage and the fixed-length boxcar filter do not use any multipliers.

13. The digital demodulator as defined in claim 11, wherein the first decimation factor is related to the first baud rate and the second decimation factor is related to the second baud rate.

* * * * *